United States Patent

[11] 3,586,917

[72] Inventor William Lee Oates
Bernardsville, N.J.

[21] Appl. No. 884,258
[22] Filed Dec. 11, 1969
[45] Patented June 22, 1971
[73] Assignee RCA Corporation

[54] SEMICONDUCTOR HYBRID POWER MODULE PACKAGE
2 Claims, 5 Drawing Figs.

[52] U.S. Cl. .......... 317/100, 174/15, 317/234 A
[51] Int. Cl. .......... H01l 1/16
[50] Field of Search .......... 317/100, 234; 174/52.5, 15, 16

[56] References Cited

UNITED STATES PATENTS

| | | | |
|---|---|---|---|
| 3,190,952 | 6/1965 | Bitko | 174/52.5 |
| 3,320,351 | 5/1967 | Glickman | 174/50.5 |
| 3,370,207 | 2/1968 | Fabel | 317/234/4 |
| 3,436,606 | 4/1969 | Reed | 174/50.52 |
| 3,509,430 | 4/1970 | Mroz | 174/DIG. 3 |

*Primary Examiner*—Lewis H. Myers
*Assistant Examiner*—Gerald P. Tolin
*Attorney*—Glenn H. Bruestle

ABSTRACT: A power module package which comprises a metal pallet of good thermal conductivity, having a cavity with semiconductor devices mounted therein. The top surface of the pallet has a rim defining an aperture which communicates with the cavity. A removable metal cover is mounted in the aperture closely engaging the rim, with a reflowable solder joint between the rim and the cover.

Alternatively, a plurality of nonhermetic pallets are vertically stacked in a metal housing, and a like cover on the housing maintains a "true" hermetic environment therein.

INVENTOR.
WILLIAM L. OATES
BY
Glenn H. Bruestle
Attorney

INVENTOR.
WILLIAM L. OATES
BY
Glenn H. Bruestle
Attorney

INVENTOR.
WILLIAM L. OATES

BY Glenn H. Bruestle
Attorney

SEMICONDUCTOR HYBRID POWER MODULE PACKAGE

BACKGROUND OF THE INVENTION

The present invention relates to packaging arrangements for semiconductor circuits, and relates in particular to packages for hybrid power circuits requiring good thermal dissipation characteristics.

While a wide variety of unique packaging arrangements have been developed concurrent with the proliferation of hybrid and integrated circuits, most of these packages are similar in certain respects. For instance, since state of the art hybrid and integrated circuits employ relatively low current devices, thermal dissipation is not a major consideration. Thus, packages for such circuits are generally made of a deformable insulating material, such as plastic or ceramic. Further, since a major advantage of hybrid and integrated circuits is their relative cheapness, the packages are not designed to be reopened or reused; rather, the packaging medium serves to permanently encapsulate the circuit.

These techniques have worked well for low current circuits; however, hybrid circuits are presently being designed for high current applications, and the above-described packaging arrangements have proven to be unsatisfactory. For example, heat dissipation becomes a major factor; thus, it becomes necessary to employ a package having good heat conductivity. Further, since hybrid power circuits are relatively expensive, it is desirable to employ techniques which allow the package to be reopened in order that the circuit may be repaired or replaced, when necessary.

Another important factor is the operating conditions of the package. Low current hybrid packages are usually employed in closed containers, or under controlled humidity and temperature conditions. On the other hand, high current hybrid circuits are being widely employed under severe humidity and corrosive conditions, for instance, as starting switches for helicopters, forklifts, and the like. Thus, a "true" hermetic environment, employing either a metal-to-metal or metal-to-glass seal, is often required.

SUMMARY OF THE INVENTION

The present hybrid power circuit package comprises a pallet of good thermal conductivity. The pallet comprises a metal body having two opposed major outer surfaces and a cavity therein, defined by a sidewall and a floor adjacent a first one of the outer surfaces with the hybrid circuit mounted on the floor. The second one of the outer surfaces has an aperture which communicates with the cavity. The package includes a metal cover removably mounted in the aperture, and means for hermetically sealing the cover around the periphery of the aperture. The package also includes means for making interconnection between the circuit and points outside the pallet.

THE DRAWINGS

DETAILED DESCRIPTION

Figure 1:
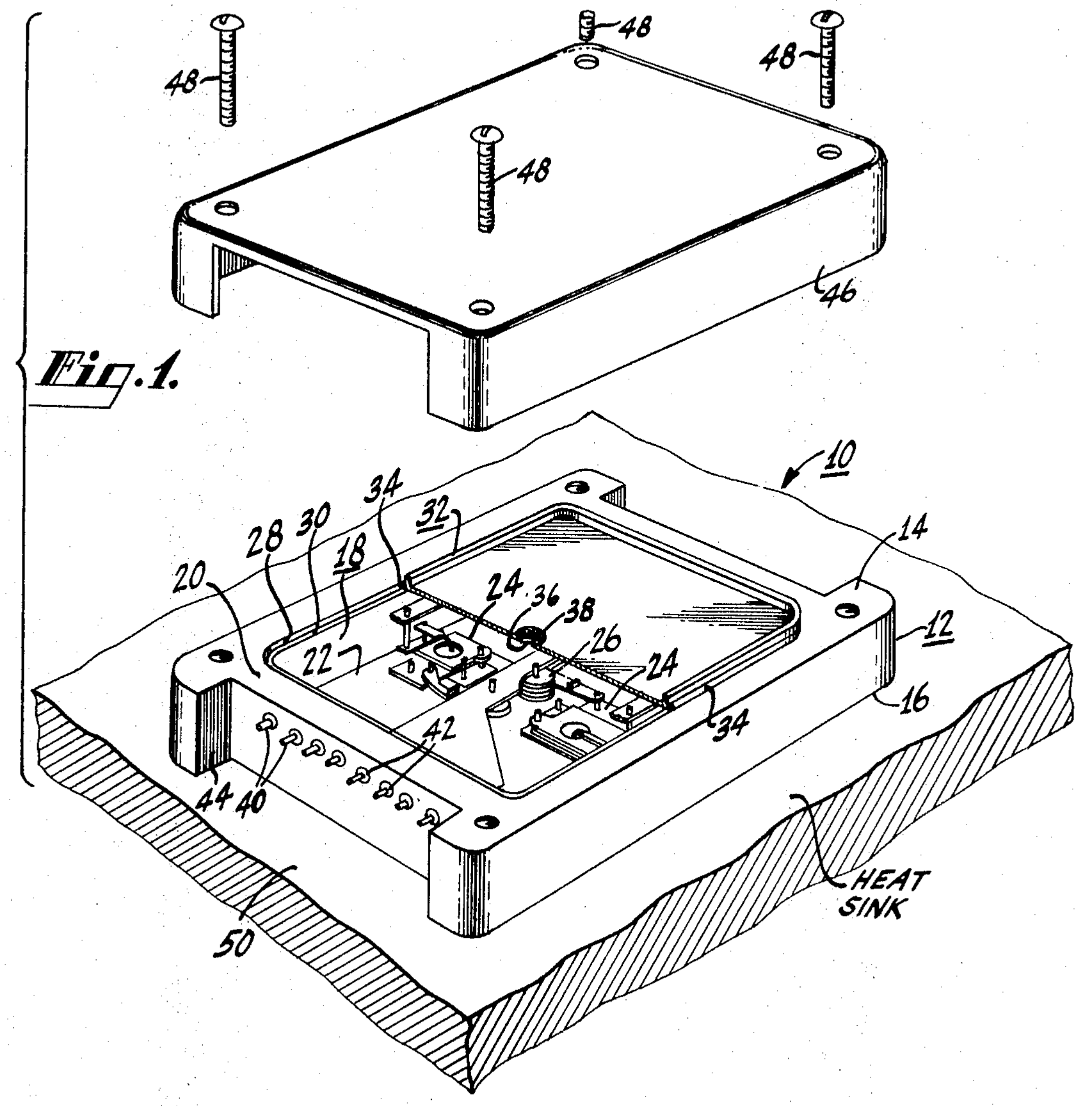
FIG. 1 is an exploded perspective view of the basic structure of the package, with a portion cut away.

A basic structure of the package will be described with reference to FIG. 1. The basic package 10 comprises a pallet 12 of good thermal conductivity. The pallet 12 comprises a metal body having opposed upper and lower surfaces 14 and 16. Preferably, the pallet 12 comprises nickel-clad copper, and is generally a rectangular parallelepiped in shape; however, other shapes, such as a round section, are also suitable.

The pallet 12 has a cavity 18 therein, defined by a sidewall 20 and a floor 22 adjacent the lower surface 16. The floor 22 is adapted to have a plurality of semiconductor devices mounted thereon, for instance, power transistors 24 and diodes 26. The top surface 14 of the pallet 12 has an aperture 28 which communicates with the cavity 18, with a rim 30 around the aperture. Preferably, the rim 30 is raised above the level of the top surface 14.

The package 10 includes a metal cover 32 which is removably mounted in the aperture 28 on the rim 30. In FIG. 1, a portion of the cover 32 is cut away. A reflowable solder joint 34 is disposed between the periphery of the cover 32 and the rim 30, to facilitate a "true" (metal-to-metal) hermetic seal. The cover 32 has a vent hole 36 which is drilled through a solder coated recess 38.

A plurality of metal pins 40 extend through the sidewall 20 and project inside the cavity 18 to provide interconnecting means between the devices 24, 26 and points external to the pallet 12. Each pin 40 is insulated from the pallet 12 by a refractory glass preform 42 which is sealed between the pin and the pallet so as to maintain the "true" hermetic environment (metal-to-glass) in the cavity 18. The sidewall 20 has a recess 44 which protects the pins 40 at the interconnection point. A nonhermetic outer shell 46 is indexed over the pallet 12 for further protection from the ambient. Screws 48 secure the shell 46 to the pallet 12, and the pallet to a heat sink 50 to insure good thermal conductivity.

The pallet 12 may also be employed in a nonhermitic version, by omitting the cover 32 and the rim 30. When used in this manner, a potting material may be deposited in the cavity 18, and over the devices 24, 26.

The pallet 12 may be fabricated by milling and machining, or by any forging or casting method well known in the art. The sidewall 20 and floor 22 may be fabricated from a single metal body, or, alternatively, may be formed separately and joined by brazing. Further, the pallet 12 may include an additional thermally conductive metal body which is adapted to closely engage the sidewall 20, when increased thermal dissipation capacity is required.

The dimensions of the pallet 12 are not critical, and among other factors depend on the thermal dissipation requirements of the circuit mounted in the cavity 18. By way of example, it has been found that a pallet 4.0" long, 3.0" wide, and 0.7" thick with a cavity 2.7" long, 2.25" wide, and 0.4" deep therein provides a thermal dissipation characteristic of 0.1° C/W for the output of a 400 amp switch which generates about 1.0 kilowatt of dissipated power.

The reflowable solder joint 34 may be formed by disposing solder on the rim 30 and the periphery of the cover 32, and locally heating the cover 30 in an inert environment (such as nitrogen) causing the solder to flow and form a uniform joint between the rim and the cover. Local heating of the cover 32 is necessary, in order that the connections of the devices 24, 26 are not damaged during formation of the solder joint 34. The vent hole 36 is sealed by reflowing the solder recess 38, closing the vent hole and making the final seal.

Figure 2:
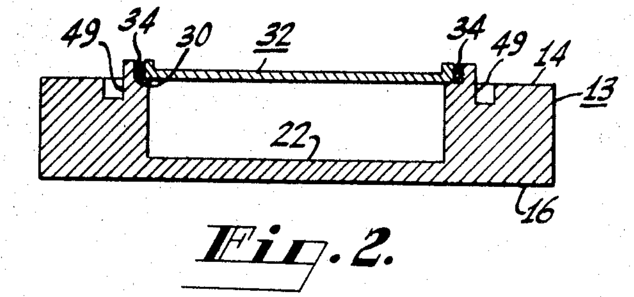
FIG. 2 is a cross-sectional view of an alternate embodiment of the package of FIG. 1.

A cross section of an alternate embodiment of the pallet 12 of FIG. 1 is illustrated in FIG. 2. The pallet 13 is essentially the same as that previously described, except that a groove 49 in the top surface 14 surrounds the rim 30, and the rim 30 is raised above the surface 14. The groove 49 and the raised rim 30 provide increased thermal isolation during the local heating of the cover 32 in which the solder joint 34 is formed.

Figures 3, 4:
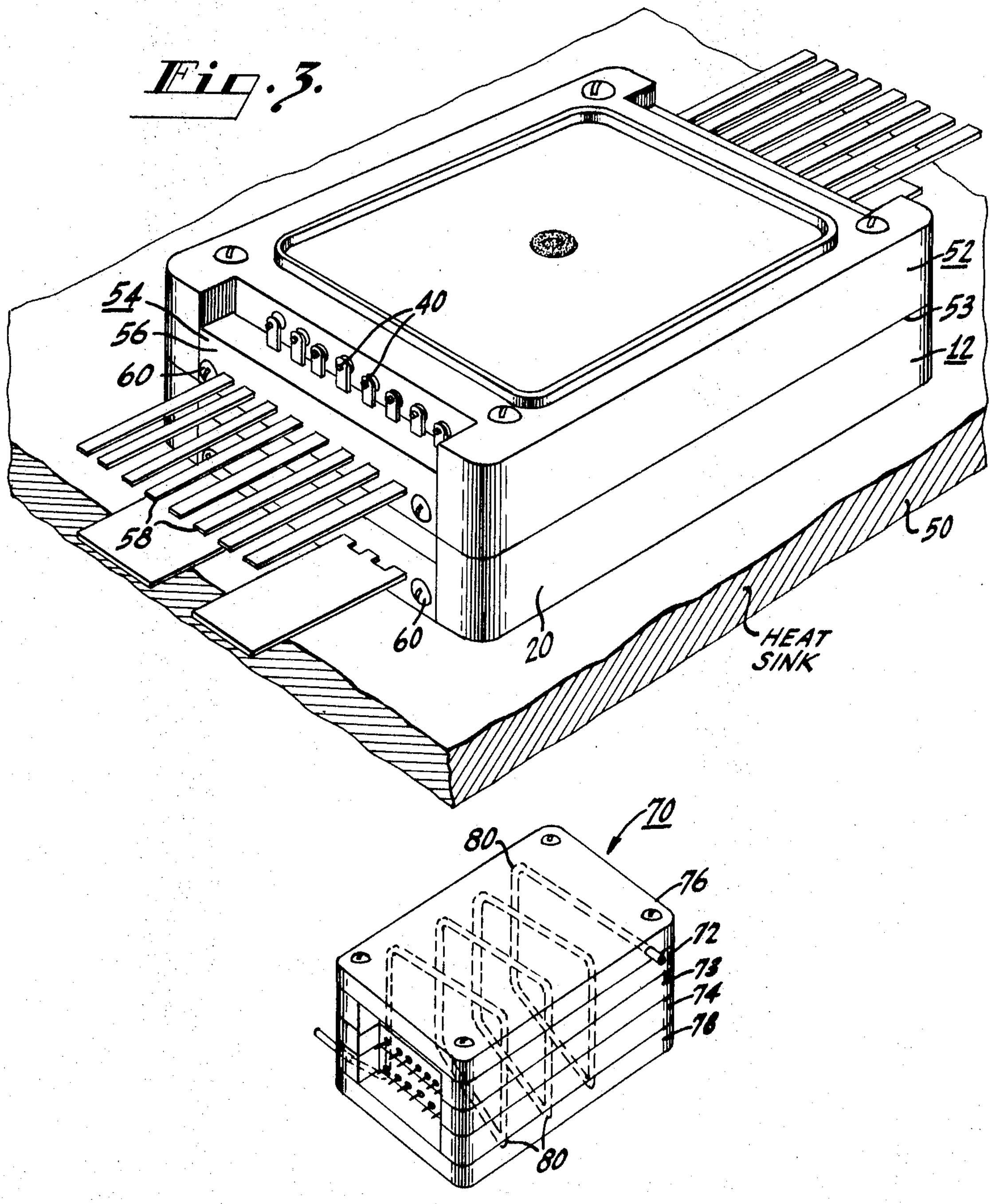
FIG. 3 is a perspective view of two vertically stacked packages of FIG. 1, utilizing an alternate termination arrangement.
FIG. 4 is a perspective view of a second embodiment of the package of FIG. 3.

As shown in FIG. 3, additional pallets, for instance pallet 52, may be vertically stacked on the pallet 12 which is affixed to the heat sink 50. A thin layer of silicone grease 53 between the pallets 12, 52 provides good thermal contact between the two. When vertically stacked in this manner, the heat flow pattern of the upper pallet 52 is such that the dissipated heat flows to the outside of the pallet and down the sidewall 20 of the lower pallet 12, and thus, to the heat sink 50.

A terminal translator 54 provides means for connecting the metal pins 40 to flat or "ribbon"-type leads. The translator 54 includes an insulating strip 56 such as a shaped body of plastic, having a plurality of metal ribbon 58 embedded in the strip 56 with one end of each of the leads 58 connected to one of each of the external ends of the pins 40. The translator 54 is fastened to the pallet 52 by screws 60.

An alternate embodiment of the vertically stacked packaging arrangement is shown in FIG. 4. This package 70 includes a plurality of vertically stacked pallets, for example, three pallets 72—74 having hybrid power circuits mounted within each pallet. The pallets 72—74 are sandwiched between a relatively thick top member 76 and a relatively thick bottom member 78. The sidewalls of the pallets 72—74 and the top and bottom member 76, 78 are provided with channels 80 which are distributed around the cavities of each pallet, and communicate with the corresponding channels 80 of the adjacent pallet 72—74, or member 76, 78. A liquid of good thermal conductivity may be circulated through the channels 80 to dissipate the heat generated by the devices during operation.

Figure 5:
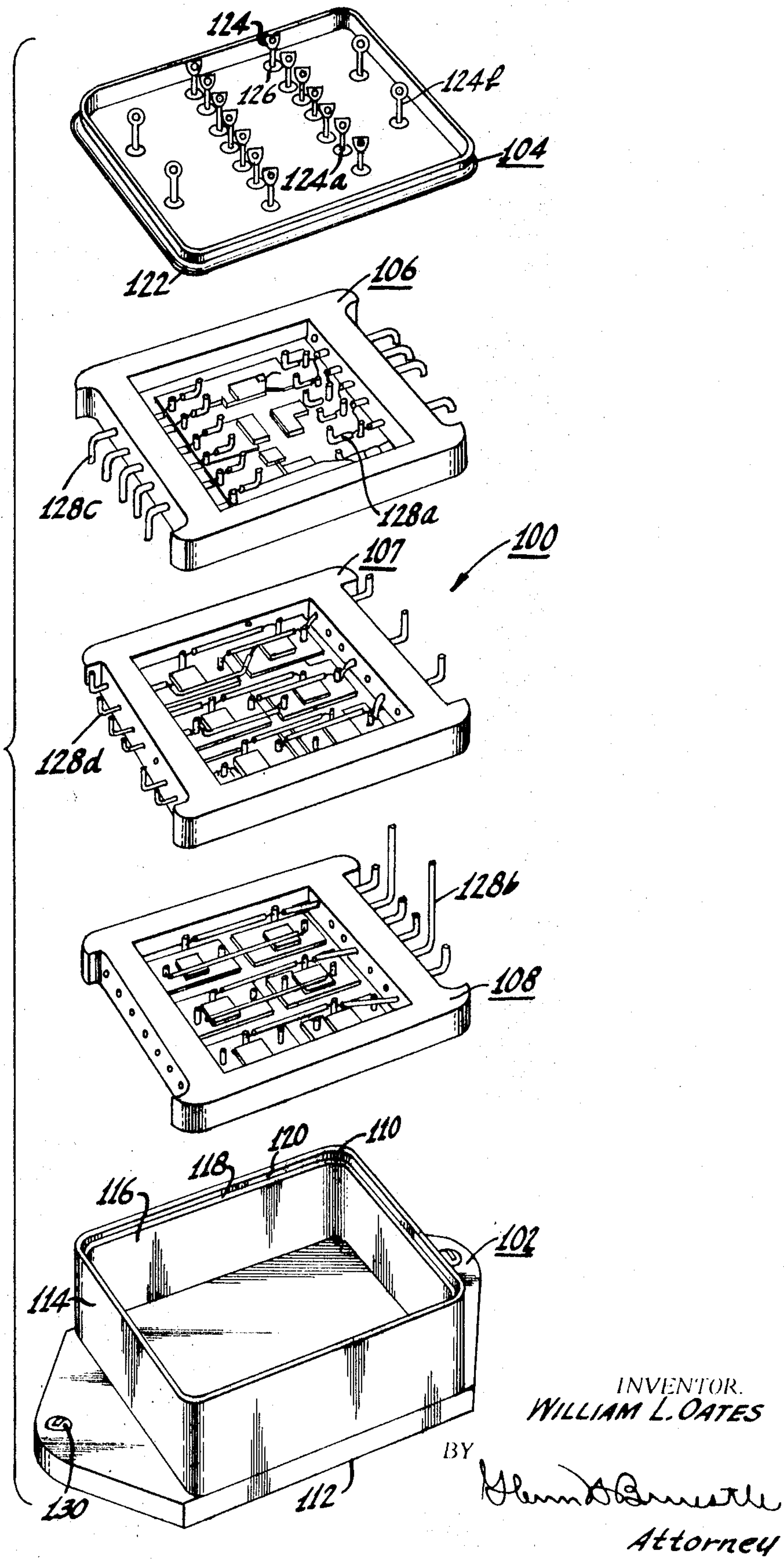
FIG. 5 is an exploded perspective view of a third embodiment of the package of FIG. 3.

A third embodiment of the vertically stacked packaging arrangement is shown in FIG. 5. The package 100 includes a metal housing 102 of good thermal conductivity, a removable metal cover 104, and a plurality of nonhermetic metal pallets, for instance, three pallets 106—108 having hybrid power circuits mounted within each pallet. By way of example, the pallets 106—108 may comprise the control, driver, and output circuits, respectively, of a high current switch.

The housing 102 has opposed upper and lower surfaces 110 and 112, respectively, and a sidewall 114 defining a compartment 116 within the housing. The top surface 110 has a rim 118 defining an aperture 120 which communicates with the compartment 114.

The pallets 106—108 are vertically stacked in the compartment 116 and the cover 104 is removably mounted in the aperture 120 of the top surface 110. The periphery of the cover 104 is adapted to closely engage the rim 118, and has a solder layer 122 deposited on the periphery to provide, after heating, a reflowable solder joint between the rim and the cover.

Interconnection between the circuits mounted in the pallets 106—108 and points external to the package 100 is provided by a plurality of terminals 124 extending through the cover 104. Each terminal 124 is insulated from the cover 104 by a refractory glass preform 126. By way of example, terminal **124*a* connects with lead 128*a* of the control circuit in pallet 106, while terminal 124*b* connects with lead 128*b* of the output circuit in pallet 108. Interconnection between the pallets 106—108 is made in a similar manner; for example, lead 128*c* of the control circuit in pallet 106 connects with lead 128*d* of the driver circuit in pallet 107**.

The package of the present invention provides many advantages. First, the package has good thermal conductivity characteristics. Second, the reflowable solder joint and removable cover allow the package to be reopened and repaired. Third, since the package has only metal-to-metal and metal-to-glass seals, a "true" heremetic environment may be maintained in the package. Fourth, the package offers a high degree of design flexibility, and may be employed with a wide variety of circuit configurations and requirements.

What I claim is:

1. A package for semiconductor hybrid power modules, comprising:

a. a pallet comprising a metal body of good thermal conductivity having two opposed major outer surfaces;
b. said pallet having a cavity therein defined by a sidewall and a floor adjacent a first one of said two outer surfaces;
c. a plurality of semiconductor devices mounted on said floor;
d. a second one of said two outer surfaces of the pallet having an aperture which communicates with said cavity;
e. a raised rim around said aperture, said second surface having a groove surrounding said rim;
f. a metal cover removably mounted in said aperture, the periphery of said cover closely engaging said rim;
g. a reflowable solder joint between the periphery of said cover and said rim;
h. a sealable vent in said cover; and
i. means for making interconnection between said devices and points outside said pallet.

2. A package according to claim 1, further comprising:

a. a second metal pallet mounted on said second surface, said second pallet also including a cavity defined by a sidewall, with semiconductor devices mounted in said cavity;
b. communicating channels within the sidewalls of each of said pallets and distributed around said cavities for circulating a liquid of good thermal conductivity through said channels to dissipate heat generated by said devices.